US011698488B2

(12) United States Patent
Nemouchi et al.

(10) Patent No.: US 11,698,488 B2
(45) Date of Patent: Jul. 11, 2023

(54) METHOD FOR FABRICATING A HETEROSTRUCTURE COMPRISING ACTIVE OR PASSIVE ELEMENTARY STRUCTURE MADE OF III-V MATERIAL ON THE SURFACE OF A SILICON-BASED SUBSTRATE

(71) Applicant: COMMISSARIAT A L'ENERGIE ATOMIQUE ET AUX ENERGIES ALTERNATIVES, Paris (FR)

(72) Inventors: Fabrice Nemouchi, Moirans (FR); Charles Baudot, Lumbin (FR); Yann Bogumilowicz, Grenoble (FR); Elodie Ghegin, Seyssinet-Pariset (FR); Philippe Rodriguez, Le Grand-Lemps (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 412 days.

(21) Appl. No.: 16/226,470

(22) Filed: Dec. 19, 2018

(65) Prior Publication Data
US 2019/0187375 A1    Jun. 20, 2019

(30) Foreign Application Priority Data

Dec. 20, 2017   (FR) ...................................... 1762569

(51) Int. Cl.
*G02B 6/13*   (2006.01)
*G02B 6/122*   (2006.01)
(Continued)

(52) U.S. Cl.
CPC ........... *G02B 6/131* (2013.01); *G02B 6/1225* (2013.01); *H01L 21/02639* (2013.01);
(Continued)

(58) Field of Classification Search
CPC .............. G02B 6/131; H01L 21/02381; H01L 21/02647; H01L 21/02461; H01L 21/02538; H01L 33/0066
See application file for complete search history.

(56) References Cited

U.S. PATENT DOCUMENTS 8,173,551 B2   5/2012   Bai et al.
9,401,583 B1   7/2016   Cheng et al.
(Continued)

FOREIGN PATENT DOCUMENTS

WO   2011/061296 A1   5/2011
WO   2017/089676 A1   6/2017

*Primary Examiner* — Matthew C Landau
*Assistant Examiner* — Mark Hatzilambrou
(74) *Attorney, Agent, or Firm* — BakerHostetler (57) ABSTRACT

A process for fabricating a heterostructure includes at least one elementary structure made of III-V material on the surface of a silicon-based substrate successively comprising: producing a first pattern having at least a first opening in a dielectric material on the surface of a first silicon-based substrate; a first operation for epitaxy of at least one III-V material so as to define at least one elementary base layer made of III-V material in the at least first opening; producing a second pattern in a dielectric material so as to define at least a second opening having an overlap with the elementary base layer; a second operation for epitaxy of at least one III-V material on the surface of at least the elementary base layer made of III-V material(s) so as to produce the at least elementary structure made of III-V material(s) having an outer face; an operation for transferring and assembling the at least photonic active elementary structure via its outer face, on an interface that may comprise passive elements and/or active elements, the interface being produced on the surface of a second silicon-based substrate; removing the first silicon-based substrate and the at least elementary base layer located on the elementary structure.

19 Claims, 12 Drawing Sheets

(51) Int. Cl.
*H01L 21/02* (2006.01)
*H01L 33/00* (2010.01)
*G02B 6/12* (2006.01)
*H01L 25/075* (2006.01)

(52) U.S. Cl.
CPC .... *H01L 21/02647* (2013.01); *H01L 33/0066* (2013.01); *H01L 33/0093* (2020.05); *G02B 2006/1213* (2013.01); *G02B 2006/12061* (2013.01); *G02B 2006/12121* (2013.01); *G02B 2006/12128* (2013.01); *G02B 2006/12142* (2013.01); *G02B 2006/12178* (2013.01); *H01L 21/02381* (2013.01); *H01L 21/02461* (2013.01); *H01L 21/02538* (2013.01); *H01L 25/0753* (2013.01)

(56) References Cited

U.S. PATENT DOCUMENTS

| | | | |
|---|---|---|---|
| 2009/0039361 A1* | 2/2009 | Li | H01L 29/205 |
| | | | 257/94 |
| 2013/0252361 A1 | 9/2013 | Li et al. | |
| 2016/0211184 A1* | 7/2016 | Previtali | H01L 23/485 |
| 2016/0327737 A1* | 11/2016 | Zhang | G02B 6/12 |
| 2017/0104060 A1* | 4/2017 | Balakrishnan | H01L 29/495 |
| 2017/0352532 A1* | 12/2017 | Dasgupta | H01L 29/0847 |
| 2018/0062353 A1* | 3/2018 | Cheng | H01L 31/1852 |
| 2018/0233500 A1* | 8/2018 | Cheng | H01L 29/42392 |

* cited by examiner

PRIOR ART

FIG.1a

PRIOR ART

FIG.1b

PRIOR ART

FIG.1c

PRIOR ART

Step 6

Step 7

Step 8

Step 9

Step 10

METHOD FOR FABRICATING A HETEROSTRUCTURE COMPRISING ACTIVE OR PASSIVE ELEMENTARY STRUCTURE MADE OF III-V MATERIAL ON THE SURFACE OF A SILICON-BASED SUBSTRATE

CROSS-REFERENCE TO RELATED APPLICATIONS

This application claims priority to foreign French patent application No. FR 1762569, filed on Dec. 20, 2017, the disclosures of which are incorporated by reference in their entirety.

FIELD OF THE INVENTION

The field of the invention is that of III-V components and relates to a process for producing a structure for photonic applications, for example a laser structure and more particularly a heterostructure of III-V layer on silicon substrate.

BACKGROUND

The heterogeneous integration for example of a III-V laser on an SOI substrate containing passive and active elements (waveguide, modulator, etc.) made of silicon generally requires the transfer of crude III-V material chips onto an InP substrate, which must then be cut and bonded.

Currently this transfer according to the prior art may be carried out according to various processes but utilizes in every instance the use of a III-V material substrate (generally an indium phosphide substrate) supporting the various epitaxial layers necessary for obtaining components made of III-V materials.

The main production steps are:
1) producing III-V chips from a substrate for example of InP typically 4 inches maximum on which a III-V layer stack defining the characteristic layers of a laser or another device (photodetector, etc.) have been grown epitaxially (the stack of epitaxial layers is inverted to bond the right way round);
2) then these layers are transferred:
either collectively having cut and placed chips on a dedicated support endowed with an imprint commonly referred to as a dedicated "holder", in order to transfer them to the substrate;
or elementaryly having previously cut the chips from 1 to a few square millimeters and then by transferring and bonding each chip elementaryly.

In all cases, the III-V material chips are supported by an InP substrate of which the initial diameter of the wafer is limited, requiring the removal of the support portion (InP substrate) which represents around 98% of the thickness.

Figure 1A:
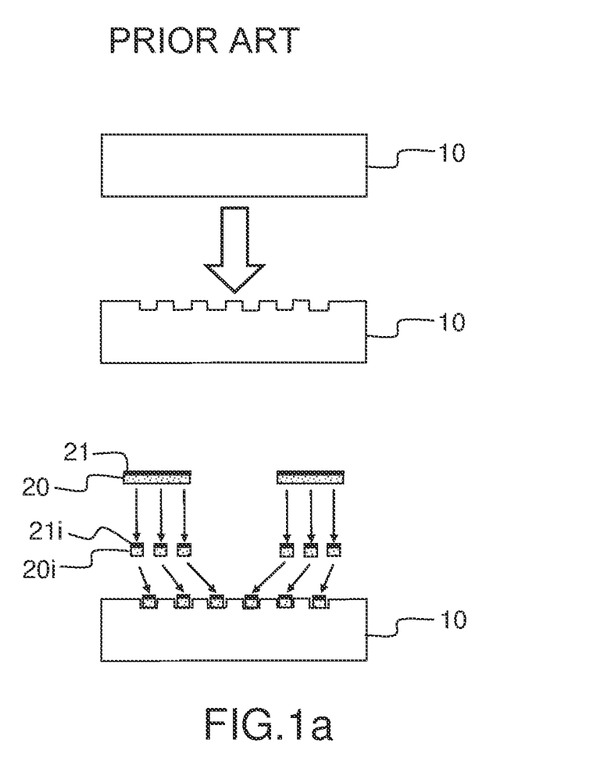
FIGS. 1a to 1c illustrate a first example of a process for transferring chips made of III-V material(s) to an SOI substrate comprising the use of a "holder" according to the prior art.
Figure 1B:
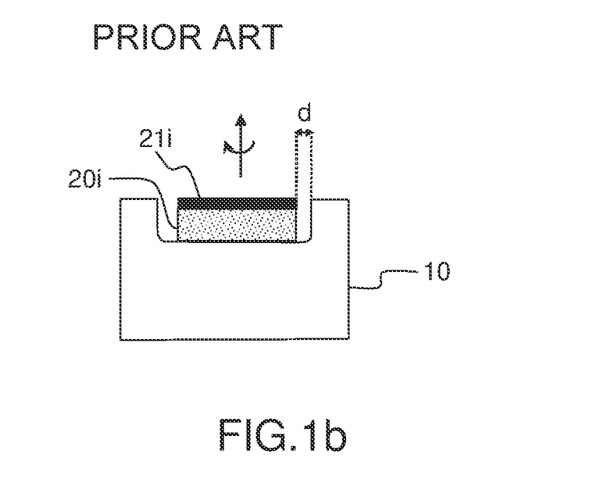
Figure 1C:
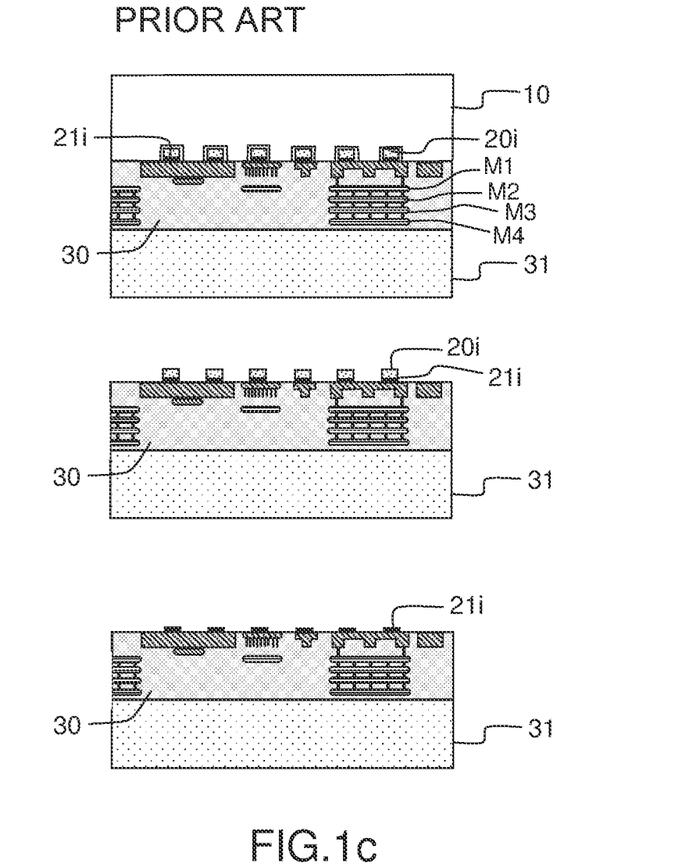

FIGS. 1a to 1c illustrate the use of a carrier substrate referred to as a "holder".

More specifically, FIG. 1a illustrates the production of unit housings etched in a substrate known as a holder 10, the simultaneous production of at least one layer 21 made of III-V material on the surface of a substrate 20 made of III-V material and the cutting of elements 21i/20i designated by the term chip throughout the present description and transferred to the "holder" 10 comprising elementary housings for receiving each of the assemblies 21i/20i.

FIG. 1b is an enlarged figure of a unit assembly 21i/20i highlighting the possible misalignment margin d and the possible rotation of each of the chips during the transfer of a chip to a dedicated housing.

FIG. 1c illustrates the collective transfer of all the chips (in the "holder") to the surface, which then becomes the bonding interface 30, of an SOI type substrate that may comprise passive and active elements (waveguide, modulator, etc.) and sets of metallizations. Said interface being positioned on the surface of a support 31 referred to as a handle.

It is necessary to have a handle because the receiving substrate has been, beforehand, thinned (on the back face) of all the silicon portion serving as support, the film of a few μm in thickness containing the photonic active and passive elements, having a diameter of 300 mm, not being able to be handled without such a handle.

The major problems encountered are the following:
the need to fabricate the "holder", with costs and difficulties of reuse;
the installation of chips on the "holder" making it necessary to cleave III-V wafers with losses;
the long and tedious procedure for installing the chips;
the problem of misalignment that may typically be 50 μm: wafer to wafer, from 100 to 150 μm: wafer to "holder" (collective transfer) with as constraint in the best-case scenario: 300 μm chips to wafer (in the context of elementary transfer);
the disassembly of the "holder" substrate resulting in the removal of the III-V substrate (which generates a cost) with a lateral reduction (no chemical selectivity);
a variability (chip bonding rate and possible misalignment, plus potential rotation effect as shown in FIG. 1b).

Figure 2:
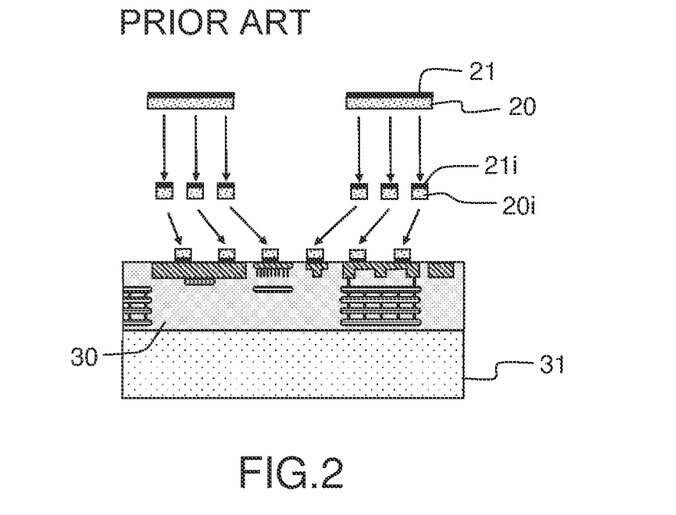
FIG. 2 illustrates a second example of a process for transferring chips to an SOI substrate comprising the elementary bonding of chips made of III-V material(s) according to the prior art.

FIG. 2 illustrates the transfer and bonding of chips 20i/21i elementaryly produced after cutting a substrate 20 of III-V material and epitaxy of elements 21 of III-V materials and positioned on a wafer comprising the SOI-type substrate, comprising an interface 30, mounted on a support referred to as a handle 31.

In this case the major problems are:
the need to cleave III-V wafers (losses);
installing the chips (long);
alignment accuracy: 50 μm wafer to wafer;
chip to chip variability;
substrate disassembly: with the removal of the III-V substrate (cost) and a lateral reduction (no chemical selectivity);
the variability: chip bonding rate and misalignment plus rotation.

Figure 3:
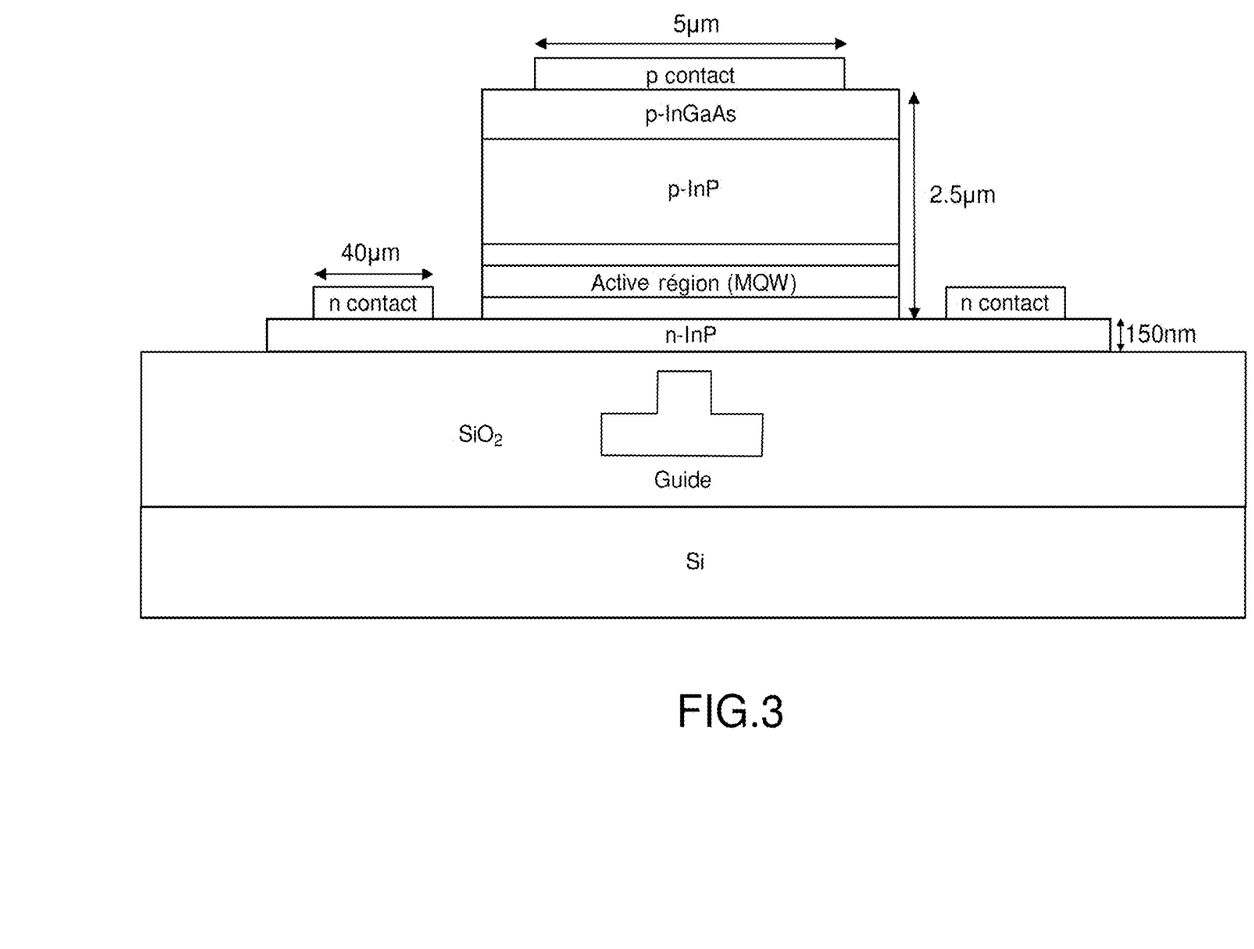
FIG. 3 illustrates the typical dimensions of a laser-type chip made of III-V materials according to the prior art.

FIG. 3 illustrates in detail a photonic active elementary structure produced in the invention, which may be of the laser type and recalls the characteristic dimensions of such a III-V laser. The III-V multilayer stack has a height typically of from 2 to 5 μm in height and a width that may typically be between 40 and 90 μm wide. An Si guide is integrated in an $SiO_2$ oxide layer produced on the surface of an Si substrate. FIG. 3 shows the n-type contacts on an n-InP base layer, a mesa structure comprising the stack of the active region consisting of a multiple quantum well structure on which a p-InP layer, a p-InGaAs layer and the p-type contact are stacked.

In this context and to solve the aforementioned drawbacks, the subject of the present invention is a process using a substrate commonly referred to as a wafer, which may be silicon or SOI as a growth substrate (or else identified as a donor substrate) as a replacement for a substrate made of III-V material (generally InP). The Applicant uses for this purpose a technique described in particular in U.S. Pat. No.

8,173,551 and comprising the epitaxy of III-V material on a first silicon substrate, so as to preform elementary substrates of III-V materials (and no longer use bulk substrates of III-V materials), on which active layers constituting, for example, a laser, can be produced, before the assembly is transferred to a second substrate that may comprise passive and active elements (waveguide, modulator, etc.).

The process of the invention has, in particular, the following advantages:
- the use of a substrate that is less expensive and easier to remove;
- the location of the epitaxial structures, thus the structures can be transferred collectively;
- the use of elementary structures, in particular of laser type, which can be prealigned on a "donor" wafer, the alignment of the chips with one another being at an accuracy linked to the lithography;
- during the transfer, a single wafer to wafer alignment for obtaining an accuracy in a range that may typically be from 10 μm to 80 μm with a mean at 50 μm;
- obtaining a preencapsulation of the chips made of III-V material in a dielectric.

SUMMARY OF THE INVENTION

More specifically, the subject of the present invention is a process for fabricating a heterostructure comprising at least one elementary structure made of III-V material on the surface of a silicon-based substrate successively comprising:
- producing a first pattern having at least a first opening in a dielectric material on the surface of a first silicon-based substrate;
- a first operation for epitaxy of at least one III-V material so as to define at least one elementary base layer made of III-V material in said at least first opening;
- producing a second pattern in a dielectric material so as to define at least a second opening having an overlap with said at least elementary base layer made of III-V material;
- a second operation for epitaxy of at least one III-V material on the surface of said at least elementary base layer made of III-V material so as to produce said at least elementary structure made of III-V material(s) having an outer face;
- an operation for transferring and assembling said at least elementary structure via its outer face, on an interface that may comprise passive elements and/or active elements, said interface being produced on the surface of a second silicon-based substrate;
- removing said first silicon-based substrate and said at least elementary base layer made of III-V material located on said elementary structure.

According to variants of the invention, said at least elementary structure is an active photonic elementary structure (laser structure with different wavelengths, modulator, photodetector, etc.).

According to variants of the invention, said at least elementary structure is a passive elementary structure (waveguide, multiplexer, etc.).

According to variants of the invention, said heterostructure may comprise at least one active photonic elementary structure and at least one passive elementary structure.

Advantageously, planarization or chemical-mechanical polishing (CMP) operations can be provided, in order to remove, for example, any non-active layers of III-V materials located above the surface plane of the pattern and to obtain a bonding surface consisting of a single plane and meeting the bonding criteria (flatness, roughness, etc.), this operation being prior to the transfer and assembly operation.

The first epitaxy operation may advantageously be followed by a polishing operation and this being before the second pattern is produced, it being possible for this polishing operation to be of chemical-mechanical type (CMP), enabling the excess of III/V material(s) overflowing from the pattern to be removed.

The polishing step following the second epitaxy operation can perform two functions: remove the excess of III-V material and prepare the surface before bonding. These may be two different processes using different chemistries and process conditions.

The substrate may typically be Si, SOI, $Si_{1-x}Ge_x$ with $0<x<1$.

According to variants of the invention, the production of said first pattern comprises:
- producing at least one primary opening having at least one lower vertical portion and one upper horizontal portion, said vertical portion being off-center with respect to said horizontal portion;
- producing at least one elementary base layer comprising a lower vertical portion and a horizontal portion;
- producing at least said photonic active elementary structure on the surface of the horizontal portion of said elementary base layer made of III-V material, off-center with respect to the lower vertical portion of said at least elementary base layer made of III-V material.

According to variants of the invention, the production of said first pattern comprises the production of at least one complex primary opening having at least:
- a lower vertical portion;
- an intermediate horizontal portion;
- an upper vertical portion;
- said lower and upper vertical portions being off-center in an opposite manner with respect to said horizontal portion;
- said first epitaxy operation defining at least one elementary base layer made of primary III-V material having at least one lower vertical portion and one horizontal portion.

According to variants of the invention, the method comprises, for producing said at least first complex opening:
- producing said lower vertical portion and said intermediate horizontal portion;
- depositing a sacrificial material in said lower vertical portion and in said intermediate horizontal portion so as to define at least one intermediate sacrificial element;
- depositing an upper dielectric layer;
- producing at least said upper vertical portion of said first opening in said upper dielectric layer so as to form at least said first complex opening;
- epitaxy of III-V material in said at least one complex primary opening, so as to form said at least elementary base layer.

The sacrificial material may advantageously be $Si_{1-x}Ge_x$ with $0<x<1$, which is polycrystalline or amorphous. Advantageously, its removal can be carried out in a mixture of gaseous HCl and dihydrogen at high temperature (typically >500° C., the chosen temperature depending on the Ge concentration of said sacrificial layer).

Advantageously, said assembly operation comprises a bonding operation, which may be a molecular bonding operation.

Another subject of the present invention is a process for producing a multiplicity of III-V devices on the same medium, the transfer of these devices being carried out collectively and allowing significant gains in the alignments. The relative alignment of the devices with one another originates from the accuracy of the photolithography processes.

More specifically, this process comprising producing a set of first patterns having first openings in a dielectric material on the surface of a first silicon-based substrate;
a first operation for epitaxy of at least one III-V material so as to define at least one set of elementary base layers made of III-V material in said first openings;
producing a set of second patterns in a dielectric material so as to define a set of second openings having an overlap with said elementary base layers made of III-V material;
a second operation for epitaxy of at least one III-V material on the surface of said elementary base layers made of III-V material so as to produce said elementary structures made of III-V material(s) having an outer face;
an operation for transferring and assembling all of the elementary structures via their outer face, on an interface (300) that may comprise passive elements and/or active elements, said interface being produced on the surface of a second silicon-based substrate (301);
removing said first silicon-based substrate and all of the elementary base layers made of III-V material located on said elementary structures.

The epitaxy steps may advantageously be followed by a polishing operation, which may be of chemical-mechanical type (CMP).

Thus, the first epitaxial operation may be followed by a polishing operation and this being before the second patterns are produced, it being possible for this polishing operation to be of chemical-mechanical type (CMP), enabling the excess III/V material(s) overflowing from the patterns to be removed.

A polishing step following the second epitaxy operation can perform two functions: remove the excess of III-V material and prepare the surface before bonding. These may be two different processes using different chemistries and process conditions.

Another subject of the invention is a process in which several different elementary structures operating at different wavelengths are produced.

To do this, said process may comprise successive epitaxy operations for producing the various elementary structures, for example photonic active elementary structures operating at different wavelengths, said operations being carried out successively at decreasing epitaxy temperatures.

Advantageously, the interface has a support commonly referred to as a "handle" on a face opposite to said second substrate. One subject of the invention is thus a process according to the invention in which said second silicon-based substrate is removed before assembly to leave exposed the interface that may comprise passive and/or active elements, said interface being on the surface of said support.

According to variants of the invention, in order to produce photonic active elementary structures, multiple quantum well structures made of III-V material(s) are advantageously produced.

According to variants of the invention, the elementary base layer made of III-V material may advantageously be InP.

Another subject of the invention is a heterostructure obtained according to the process of the invention, it being possible for said heterostructure to advantageously comprise at least one structure of laser or photodetector or modulator type.

Another subject of the invention is a set of elementary structures made of III-V material on the surface of a silicon-based substrate obtained according to the process of the invention, which may advantageously comprise a set of laser structures operating at different wavelengths.

BRIEF DESCRIPTION OF THE DRAWINGS

A better understanding of the invention will be obtained and other advantages will become apparent on reading the description which will follow, given without limitation, and by virtue of the figures, among which.

DETAILED DESCRIPTION

The present invention is described in more detail within the context of active photonic elementary structure(s), but can also be applied within the context of passive elementary structure(s).

The process of the invention exploits the process of epitaxy by crystalline defect trapping (related to the lattice mismatch) making it possible to use a base substrate made of a semiconductor material such as silicon, produced beforehand on which are elementary base layers made of III-V material intended for the epitaxial growth of photonic active elementary structures such as, for example, multiple quantum well structures, of which the choice of the nature of the layers and their thicknesses determine the operating wavelengths.

The elementary base layers made of III-V material can be produced with high aspect ratios advantageously enabling defects related to the heterostructure to be trapped. High aspect ratio growth techniques have been described in U.S. Pat. No. 8,173,551.

The process of the invention may be available in at least the two following alternatives, which are described in detail in the remainder of the description:

first alternative: the process comprises two series of operations for lithography and epitaxy of III-V material(s);

second alternative: the process comprises the fabrication of a particular pattern with use of a sacrificial layer, in which an operation for epitaxy of III-V material(s) is performed.

The Applicant hereinafter describes various examples of the process according to the invention.

Example of a Process of the Invention According to the First Alternative

Figure 4A:
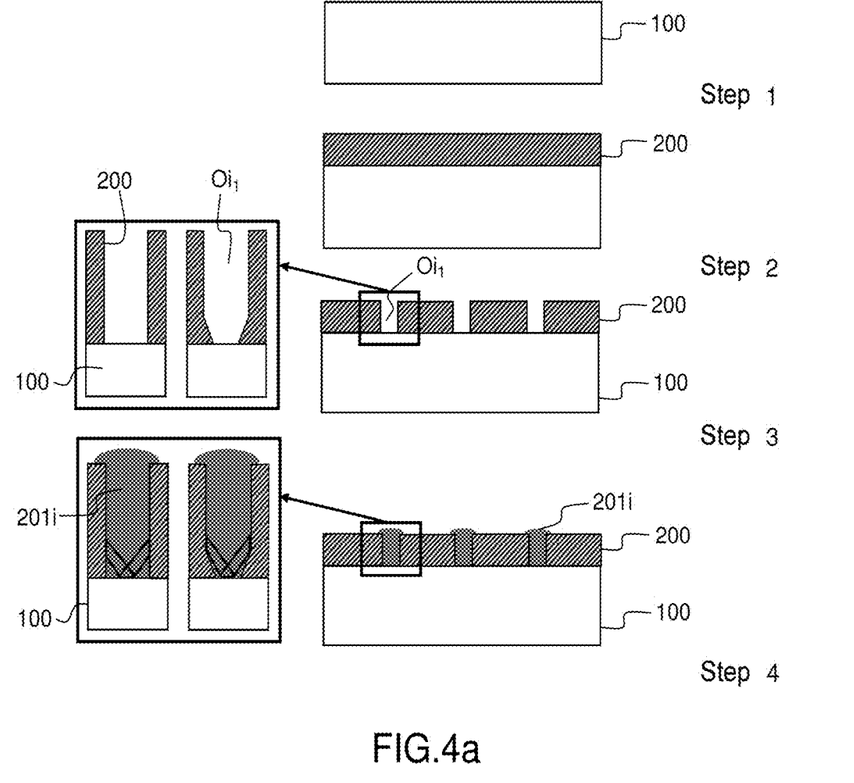
FIGS. 4a to 4f illustrate the main steps of a first example of a process according to the invention.

FIG. 4a illustrates the following first steps:

Step 1: a low-cost first substrate 100 made of silicon is used.

Step 2: starting from this first substrate 100, a dielectric layer 200 is produced.

Step 3: openings $O_{1i}$ are produced in the layer 200 so as to define a pattern with openings as illustrated in FIG. 4a. The box shows an enlargement highlighting the type of straight or beveled sidewalls that can be obtained in the openings.

Step 4: a first operation for epitaxy of III-V material that may be InP is carried out so as to define elementary base layers made of III-V material: 201i.

Figure 4B:
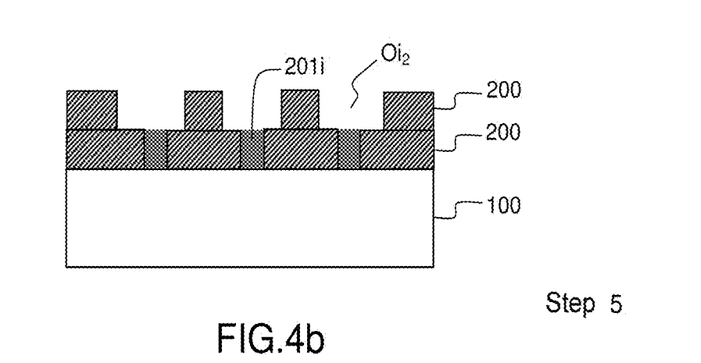

FIG. 4b illustrates step 5: after having carried out a planarization operation of CMP (chemical-mechanical polishing) type, a second dielectric layer 200 is deposited in which second openings $O_{i2}$ are produced so as to define a second pattern.

Figure 4C:
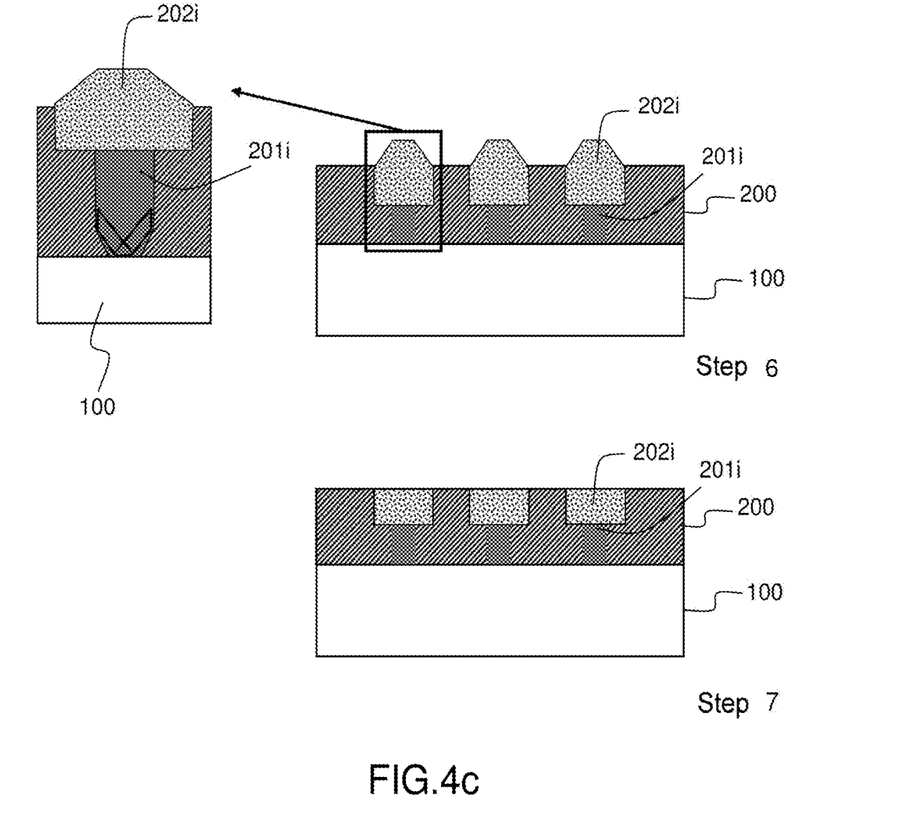

FIG. 4c illustrates step 6: a second operation for epitaxy of III-V material(s) is carried out so as to define photonic active elementary structures 202i, then, in step 7 a planarization operation is carried out.

The second openings have widths greater than those of the first openings so as to allow the lateral growth of III-V material(s) from the III-V material substrates. The growth defects can advantageously be confined in the cavities (the dislocations are stopped by the walls of the cavity) of the substrates and make it possible to grow III-V material(s) from the substrates 201i. Typically, from an Si substrate, the defects related to the relaxation of the layers are found mainly in {111} crystal planes forming an angle of 54.7° with the surface of the substrate. Thus, if the height of the cavity $O_{1i}$ is greater than tan (54.7°), the defects of these planes can be confined, typically, if the height is more than 1.4 times the width of the cavity. The higher this ratio, the higher the confinement effect.

Figure 4D:
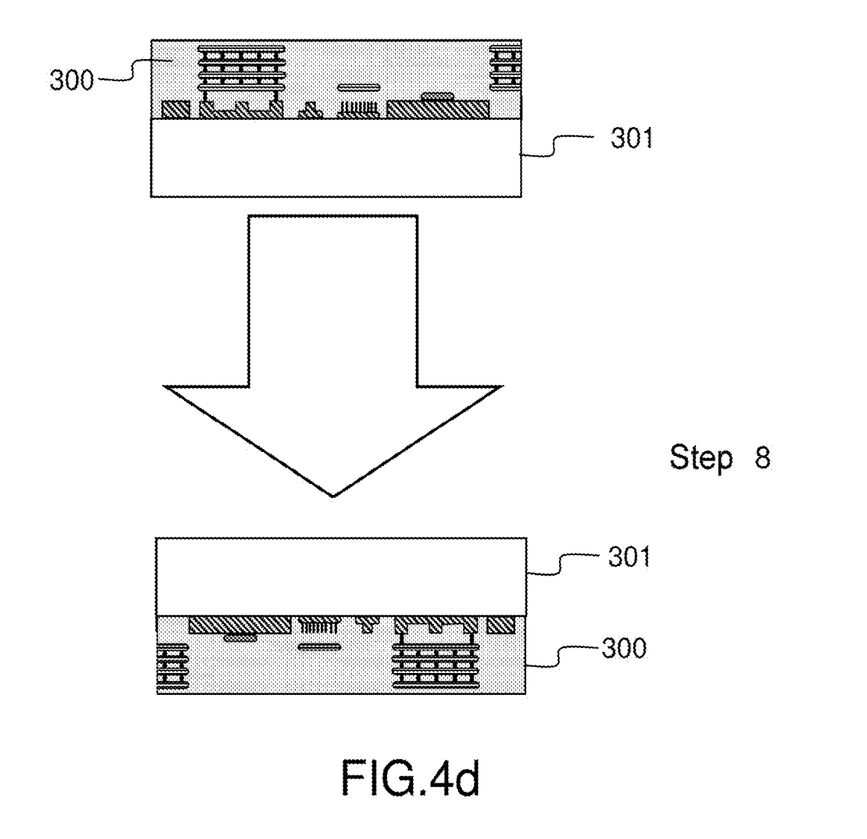

FIG. 4d illustrates the second substrate used in the process of the invention. This substrate may be of SOI type which may comprise passive and active elements (waveguide, modulator, etc.) and sets of metallizations. It comprises a silicon portion 301 and a portion integrating the passive or active components 300 intended to address the photonic active elementary structure or structures produced on the surface of the first substrate 100, said second substrate being presented turned over (Step 8) in order to carry out the assembly operation.

Figure 4E:
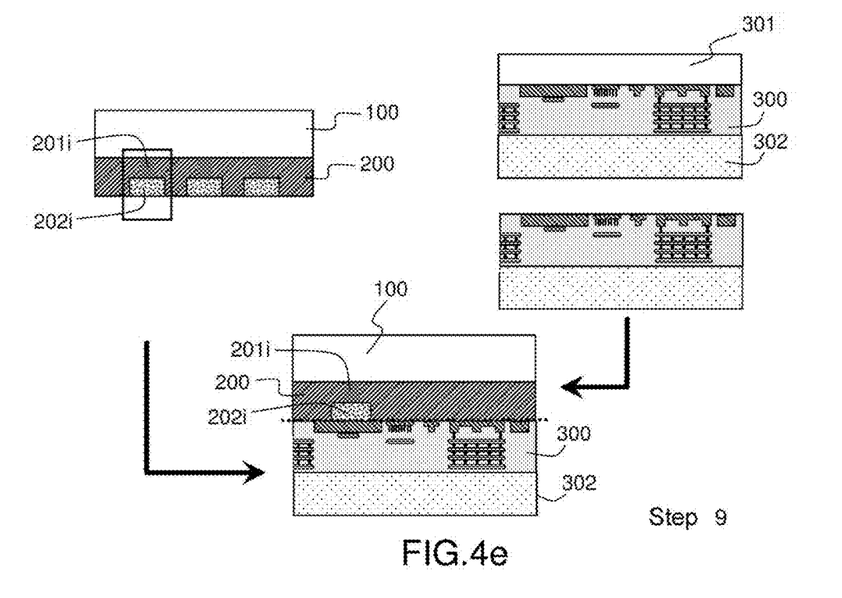

Step 9: For the purposes of the transfer, this second substrate is positioned on a support referred to as a handle 302 and the assembly operation is carried out with the elementary structure or structures produced at the same time, as illustrated in FIG. 4e. Typically, the assembly operation can be performed through a molecular bonding operation.

Figure 4F:
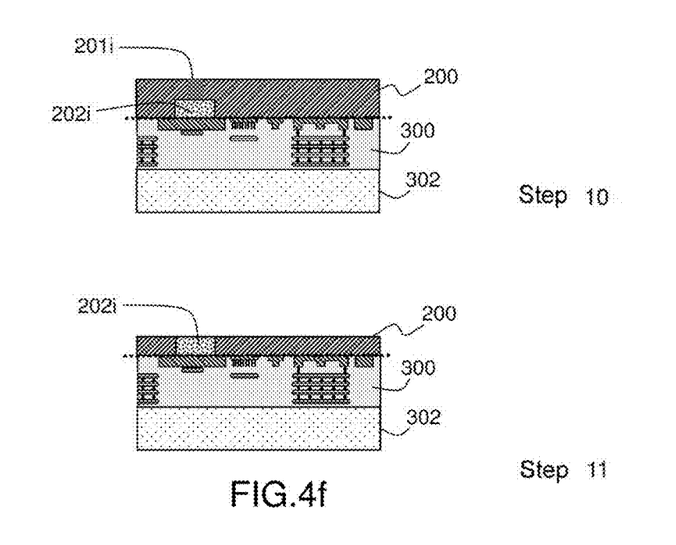

Step 10: the lower portion 100 of the first substrate is removed as shown in FIG. 4f, exposing the elementary substrates 201i by a mechanical thinning operation, and then cleaning as illustrated in FIG. 4f.

Step 11: finally, the portion of the substrate comprising the dielectric 200 and the elementary base layers made of III-V material 201i are removed to release the photonic active elementary structures 202i as also illustrated in FIG. 4f.

Example of a process of the invention according to the second alternative:

Advantageously, the elementary base layer made of III-V material may be made to comprise a first narrow vertical lower portion capable of trapping growth defects from the first substrate and a wider upper horizontal portion, said lower portion being off-center with respect to said horizontal portion, in order to be able to carry out the growth of the photonic active elementary structure in an offset manner.

Figure 5:
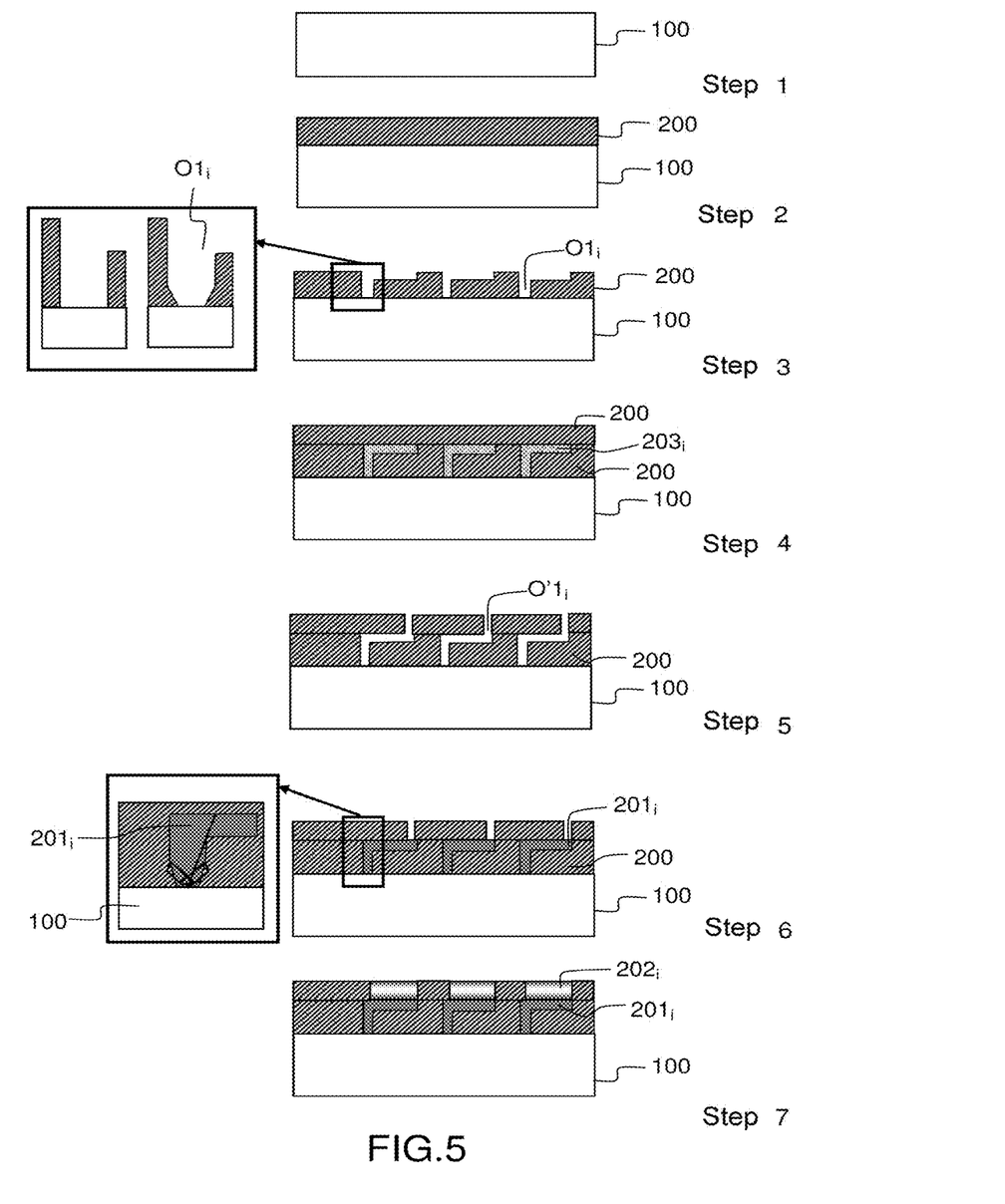
FIG. 5 illustrates the various steps of a second example of a process of the invention comprising the production of a primary pattern having first complex openings for off-centering photonic active elementary structures with respect to the elementary substrates made of III-V material.

FIG. 5 illustrates the various steps of this second example of a process:

Step 1: a low-cost first substrate 100 made of silicon is used.

Step 2: starting from this substrate 100, a dielectric layer 200 is produced.

Step 3: openings $O_{1i}$ are produced in the layer 200 so as to define a pattern with openings, having a vertical lower portion and a horizontal portion, said lower vertical portion being off-center with respect to said horizontal portion. The box shows an enlargement highlighting the type of straight or beveled sidewalls that can be obtained in the vertical portion of the openings.

Step 4: a sacrificial material is deposited so as to define elements 203i in the previously formed openings. A dielectric layer 200 is then deposited.

Step 5: defined in the dielectric layer 200 are new openings constituting the upper vertical portion of the first complex openings $O'_{1i}$, while also removing the sacrificial material.

The advantage of this first complex opening lies in the fact that the horizontal portion is partially covered with dielectric, which makes it possible to avoid a subsequent CMP step for making the surface of the elementary base layer made of III-V material uniform.

Step 6: a first operation for epitaxy of III-V material is carried out that makes it possible to form the elementary base layers made of III-V material 201i. The box highlights the offset appearance of the dislocations in the lower vertical portion of the elementary base layer relative to the horizontal portion of said elementary base layer.

Step 7: second openings (not shown) are produced in which new epitaxy operations are carried out in order to produce the photonic active elementary structures 202i.

Figure 6:
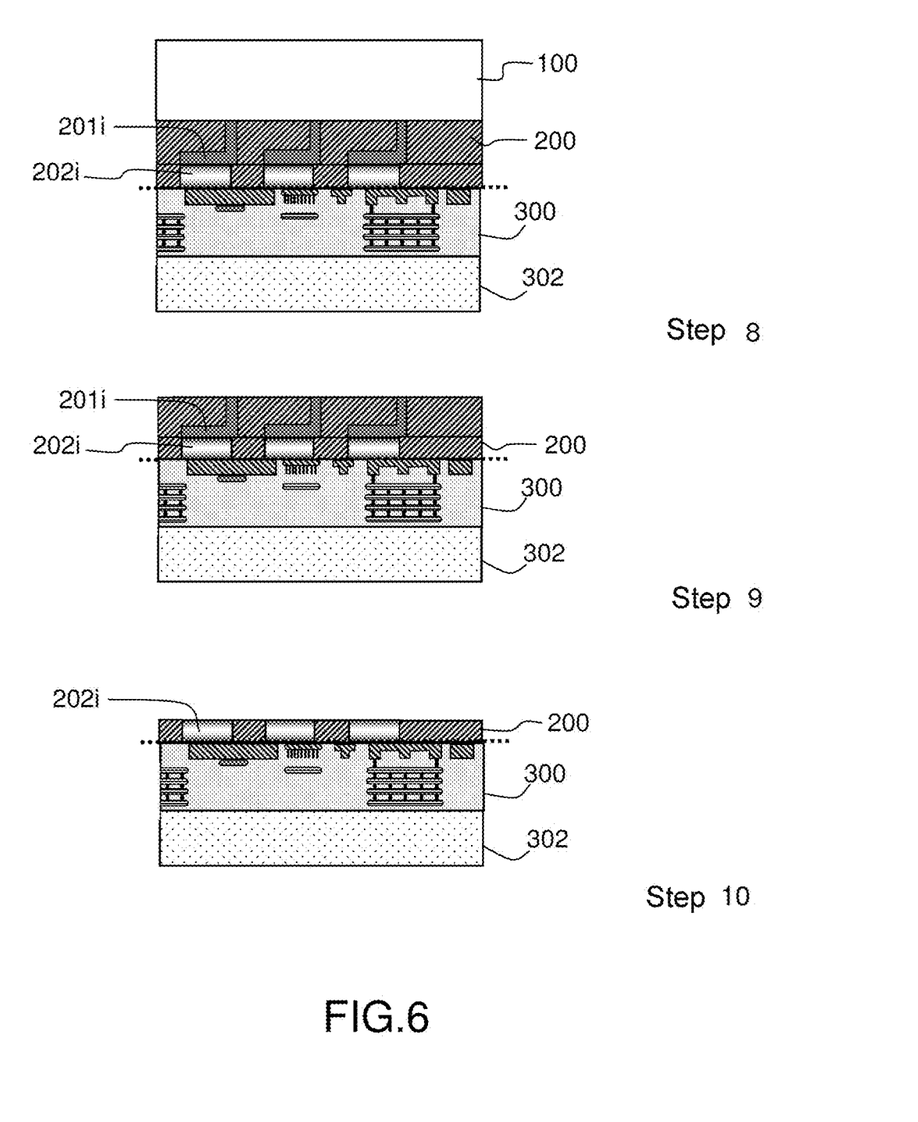
FIG. 6 illustrates the operation for transferring and assembling photonic active elementary structures obtained according to the operations described in FIG. 5.

The following steps of transferring the second silicon-based substrate and active and/or passive components may be identical to those of the first process example described above and are illustrated in FIG. 6 which illustrates the following steps:

Step 8: the two substrates comprising on the one hand elementary base layers made of III-V material and on the other hand the support comprising an interface with active and/or passive components are assembled and bonded.

Step 9: the portion 100 is removed from the first substrate, exposing the elementary base layers made of III-V material 201i by a mechanical thinning operation.

Step 10: finally, the portion of the upper substrate comprising the dielectric 200, and the elementary base layers made of III-V material 201i are removed to release the photonic active elementary structures 202i.

Examples of dimensions of the photonic active elementary structures that can be produced according to the process of the invention are illustrated by means of FIGS. 7a to 7e.

Figure 7A:
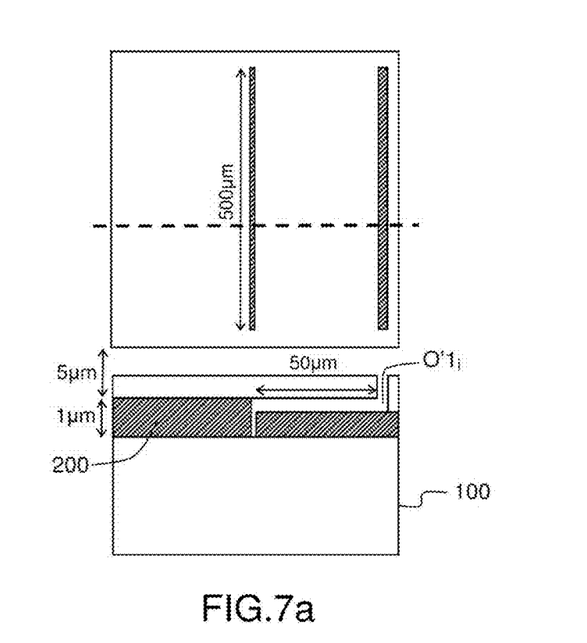
FIGS. 7a to 7d show top views and transverse views highlighting the dimensions of photonic active elementary structures in a process according to the invention.

Typically, the first complex openings $O'_{1i}$ may have surfaces of 50 to 100 µm×500 µm.

The thicknesses of the successive dielectric layers making it possible to define said first complex openings may be respectively 1 µm and 5 µm, as illustrated in FIG. 7a.

Figure 7B:
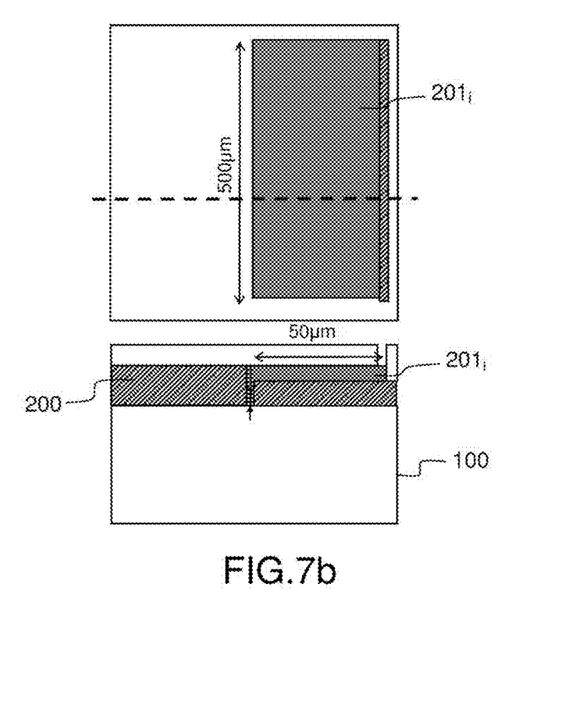

FIG. 7b shows the production of an elementary base layer made of III-V material which is made of InP deposited by epitaxy in said complex opening. The thickness of InP may typically be between 5 and 10 µm with charge effects of between 5 and 10.

In general, the charge effect corresponds to the difference in thickness observed when a same epitaxy process is performed on (i) an unpatterened substrate, (ii) a patterned substrate, i.e. a substrate partially covered with $SiO_2$ type pattern material.

The thickness obtained is often greater in case (ii). The ratio of thickness in case (ii) to thickness obtained in case (i) defines the charge effect.

In the present invention, an equivalent thickness of 5 to 10 µm on an unpatterned substrate should make it possible to produce a lateral growth of 10 to 50 µm in the cavities by lateral growth on a patterned substrate, thus benefiting from the presence of the charge effect.

Figure 7C:
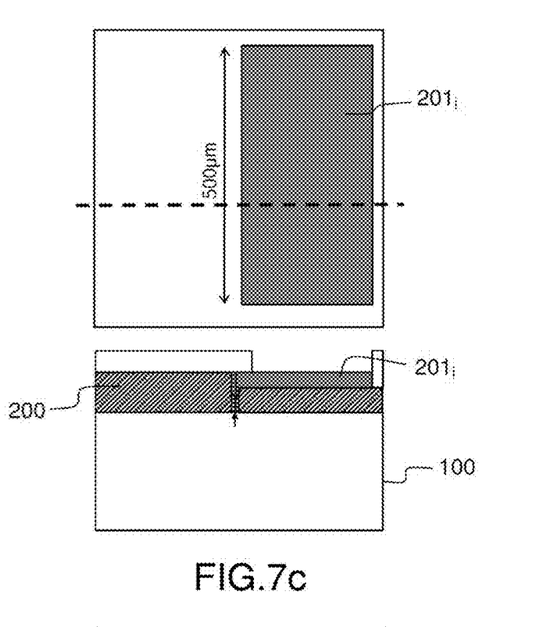

FIG. 7c shows the production of a second opening in a conventional manner by photolithography.

Figure 7D:
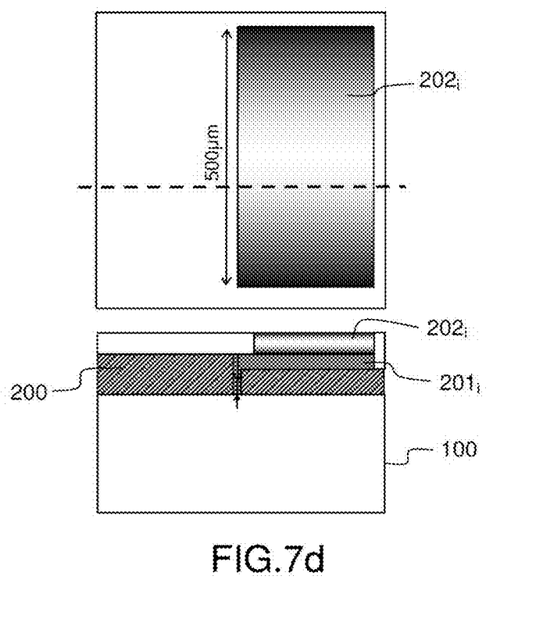

FIG. 7d shows the epitaxial growth of the photonic active elementary structure made of III-V material(s), which may have a thickness typically between a few nanometers and a few microns depending on the intended applications.

The process of the present invention makes it possible to sequence localized epitaxy operations, thus making it possible to produce different photonic active elementary structures, and in particular consisting of different III-V materials or different multiple quantum well structures, so as to fabricate within the same assembly several different photonic functions that can operate at different wavelengths.

Figure 8:
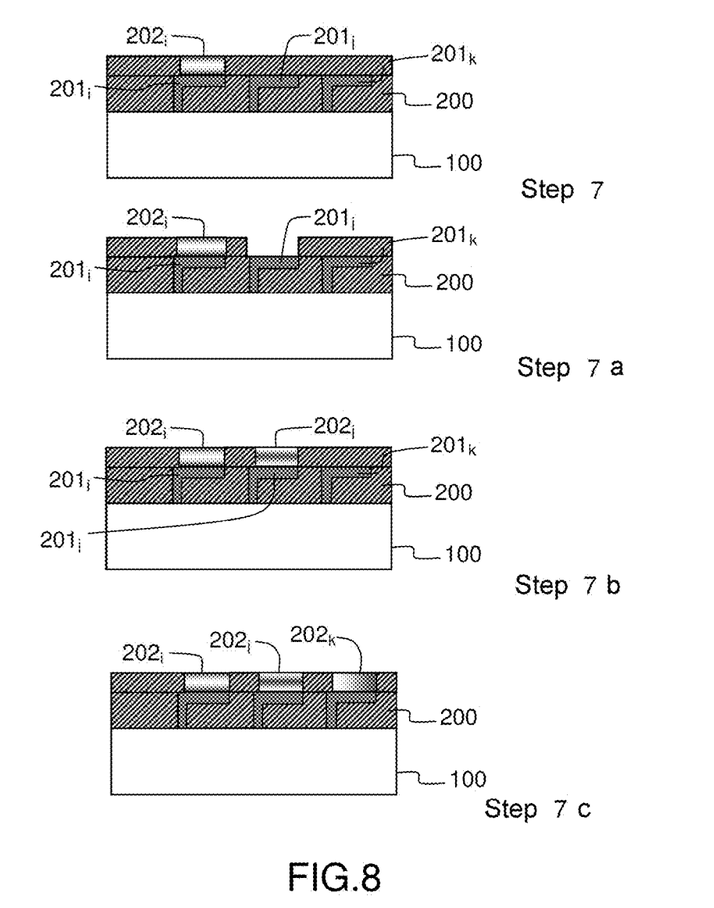
FIG. 8 illustrates an example of successive steps for fabricating different elementary structures according to the process of the invention.

FIG. 8 highlights steps 7, 7a, 7b and 7c corresponding to step 7 of the process described in FIG. 5 and relating to successive epitaxy steps allowing the formation of different elementary structures 202i, 202j, 202k from elementary base layers made of III-V material: 201i, 201j, 201k and by performing different masking operations. Step 7a thus demonstrates that after having carried out a first epitaxial growth operation to produce the elementary structure 202i, a masking operation is carried out for the epitaxial growth of the elementary structure 202j.

Figure 9:
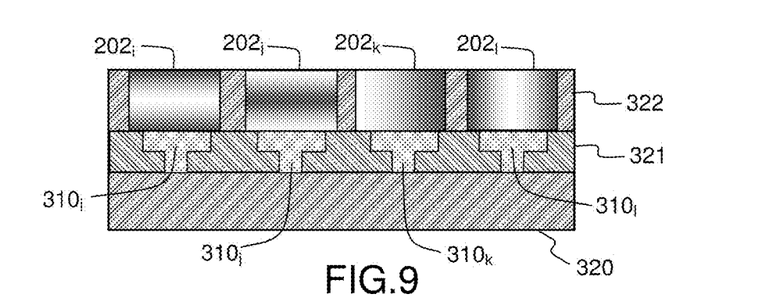
FIG. 9 illustrates a set of different photonic active elementary structures.

FIG. 9 illustrates an exemplary configuration showing 4 different photonic active elementary structures 202i, 202j, 202k, 202l comprising multiple quantum wells between layers of III-V materials and assembled, at the silicon guide elements respectively 310i, 310j, 310k, 310l made in the substrate 300 comprising three levels of $SiO_2$ dielectric 320, 321 and 322, the layer 322 advantageously encapsulating the 4 photonic active elementary structures.

It could also be a question of different components (lasers, photodetector, modulator made of III-V).

According to the process of the invention, it is thus possible to produce, owing to each of the epitaxy operations, an optimized component: laser/modulator/photodetector, having a size of the order of a few tens of microns.

The invention claimed is:

1. A process for fabricating a heterostructure comprising at least one active photonic elementary structure made of III-V material on a surface of a silicon-based substrate, the process comprising:
    producing a first pattern having at least one first opening having a first width and a first height in a first dielectric material on the surface of a first silicon-based substrate, wherein the first height is more than 1.4 times the first width, and wherein producing the first pattern comprises:
        producing a layer of the first dielectric material covering an entirety of the surface of the first silicon-based substrate;
        producing the at least one first opening in the layer of the first dielectric material, the at least one first opening comprising at least one primary opening having one lower vertical portion and one upper horizontal portion, said lower vertical portion being off-center with respect to said upper horizontal portion;
    producing at least one elementary base layer made of III-V material comprising a lower vertical portion and a horizontal portion, wherein the at least one elementary base layer is produced by performing a first operation for epitaxy of the III-V material; and
    producing said active photonic elementary structure on a surface of the horizontal portion of said at least one elementary base layer made of III-V material, off-center with respect to the lower vertical portion of said at least one elementary base layer made of III-V material;
    after performing the first operation for epitaxy, producing a second pattern in a second dielectric material so as to define at least one second opening having an overlap with said at least one elementary base layer made of III-V material;
    a second operation for epitaxy of at least one III-V material on the surface of the horizontal portion of said at least one elementary base layer made of III-V material so as to produce said at least one elementary structure made of III-V material(s) in said at least one second opening, said at least one elementary structure having an outer face;
    an operation for transferring and assembling said at least one elementary structure via its outer face, on an interface that comprises passive elements and/or active elements, said interface being produced on a surface of a second silicon-based substrate; and
    removing the entirety of said first silicon-based substrate and of said at least one elementary base layer made of III-V material located on said at least one elementary structure,
    wherein said at least one elementary base layer made of III-V material in said at least one first opening is configured so that growing defects of the heterostructure are confined in said at least one elementary base layer.

2. The process according to claim 1, wherein said at least elementary structure is a passive elementary structure.

3. The process according to claim 1, comprising polishing operations of chemical-mechanical type, carried out after the epitaxy operations.

4. The process according to claim 3, comprising a chemical-mechanical polishing operation prior to the transfer and assembly operation.

5. The process according to claim 1, wherein the production of said first pattern further comprises the production of at least one complex primary opening having at least:
- the lower vertical portion of the at least one primary opening;
- an intermediate horizontal portion comprising the upper horizontal portion of the at least one primary opening: and
- an upper vertical portion;
- said lower and upper vertical portions of the complex primary opening being off-center in an opposite manner with respect to said intermediate horizontal portion; and
- said first operation for epitaxy defining said at least one elementary base layer made of primary III-V material being III-V material having the lower vertical portion and the horizontal portion.

6. The process according to claim 5, comprising:
- producing said lower vertical portion and said intermediate horizontal portion of said at least one complex primary opening;
- depositing a sacrificial material in said lower vertical portion and in said intermediate horizontal portion so as to define at least one intermediate sacrificial element;
- depositing an upper dielectric layer comprising the second dielectric material;
- producing said upper vertical portion of said at least one complex primary opening in said upper dielectric layer so as to form said at least one complex primary opening; and
- the first operation for epitaxy of at least one III-V material in said at least one complex primary opening, so as to form said at least one elementary base layer made of primary III-V material.

7. The process according to claim 6, wherein the sacrificial material is $S_{1-x}Ge_x$ with $0<x<1$, which is polycrystalline or amorphous.

8. The process according to claim 7, further comprising removal of said sacrificial material carried out in a mixture of gaseous HCl and dihydrogen at a temperature above 500° C.

9. The process according to claim 1, wherein said operation for assembling comprises a bonding operation.

10. The process according to claim 9, wherein said bonding operation is a molecular bonding operation.

11. The process according to claim 1, comprising:
- producing a set of the first patterns having the at least one first opening in the first dielectric material on the surface of the first silicon-based substrate;
- the first operation for epitaxy of at least one III-V material so as to define a set of the elementary base layers made of III-V material in said at least one first opening;
- producing a set of the second patterns in the second dielectric material so as to define a set of the at least one second opening having an overlap with said elementary base layers made of III-V material;
- the second operation for epitaxy of at least one III-V material on the surface of said elementary base layers made of III-V material so as to produce said elementary structures made of III-V material(s) having outer faces;
- the operation for transferring and assembling all of the elementary structures via their outer faces, on the interface comprising passive elements and/or active elements, said interface being produced on the surface of the second silicon-based substrate; and
- the removing said first silicon-based substrate and all of the elementary base layers made of III-V material located on said elementary structures.

12. The process according to claim 11, wherein several different photonic active elementary structures operating at different wavelengths are produced.

13. The process according to claim 11, comprising successive epitaxy operations in order to produce the various elementary structures, said operations being carried out successively at decreasing epitaxy temperatures.

14. The process according to claim 1, wherein a support is located on a face opposite to said second substrate, said process comprising removal of said second substrate before the assembling, to leave exposed the interface that comprises passive and/or active elements, said interface being on a surface of said support.

15. The process according to claim 1, wherein the active photonic elementary structure comprises a multiple quantum well structure made of III-V material(s).

16. The process according to claim 1, wherein the at least one elementary base layer made of III-V material is made of InP.

17. A heterostructure obtained according to the process of claim 1.

18. The heterostructure according to claim 17, comprises at least one laser or photodetector or modulator structure.

19. The heterostructure according to claim 17, comprises a set of laser structures operating at different wavelengths.

* * * * *